United States Patent
Danti et al.

(10) Patent No.: US 9,026,970 B2
(45) Date of Patent: May 5, 2015

(54) PRIORITIZED DESIGN FOR MANUFACTURING VIRTUALIZATION WITH DESIGN RULE CHECKING FILTERING

(71) Applicants: Kenneth J. Danti, Driftwood, TX (US); Ertugrul Demircan, Austin, TX (US)

(72) Inventors: Kenneth J. Danti, Driftwood, TX (US); Ertugrul Demircan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 38 days.

(21) Appl. No.: 13/788,046

(22) Filed: Mar. 7, 2013

(65) Prior Publication Data

US 2014/0258951 A1  Sep. 11, 2014

(51) Int. Cl.
*G06F 17/50* (2006.01)

(52) U.S. Cl.
CPC .................................. *G06F 17/5081* (2013.01)

(58) Field of Classification Search
CPC .................................................. G06F 17/5081
USPC .................................................. 716/100, 112
See application file for complete search history.

(56) References Cited

U.S. PATENT DOCUMENTS

| | | | |
|---|---|---|---|
| 7,506,277 B1 | 3/2009 | Arora et al. | 716/122 |
| 7,689,951 B2 | 3/2010 | Cazeaux | 716/106 |
| 8,201,111 B2 | 6/2012 | Hou et al. | 716/54 |
| 8,769,454 B1 * | 7/2014 | Tsay et al. | 716/106 |
| 2008/0115096 A1 * | 5/2008 | Pikus | 716/4 |
| 2008/0134106 A1 | 6/2008 | Riviere-Cazaux | 716/54 |
| 2009/0158223 A1 | 6/2009 | Gray et al. | 716/132 |
| 2011/0282478 A1 * | 11/2011 | Shen et al. | 700/104 |
| 2012/0124536 A1 * | 5/2012 | Sharma | 716/112 |

* cited by examiner

*Primary Examiner* — Suchin Parihar
(74) *Attorney, Agent, or Firm* — VanLeeuwen & VanLeeuwen; Jonathan N. Geld

(57) ABSTRACT

An approach is provided to generate a number of virtualized circuit designs by applying design-for-manufacturing (DFM) processes to a circuit design. The virtualized circuit designs are checked using design rule checks (DRCs), with the checking resulting in a design rule error quantity that corresponds to each of the virtualized circuit designs. One of the virtualized circuit designs is selected for use in manufacturing the circuit design with the selection based each of the design's design rule error quantities.

20 Claims, 5 Drawing Sheets

PRIORITIZED DESIGN FOR MANUFACTURING VIRTUALIZATION WITH DESIGN RULE CHECKING FILTERING

TECHNICAL FIELD

The present disclosure relates to an approach to improve circuit design methodologies. More particularly, the approach virtualizes designs based on design for manufacturing (DFM) priorities while filtering out designs that fail design rule checking (DRC).

BACKGROUND

Current design for manufacturing (DFM) improvability processes provide various DFM layout improvement suggestions. The layout designer manually implements DFM suggestions in the layout and executes a separate design rule checking (DRC) in order to identify any design rule check violations. Traditional DFM improvability processes therefore have many DRC issues arise as a result of the DFM suggestions not being filtered adequate for DRC errors. The DFM improvements are manually re-coded in an essentially trial-and-error process that is exceedingly time consuming.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

Figure 1:
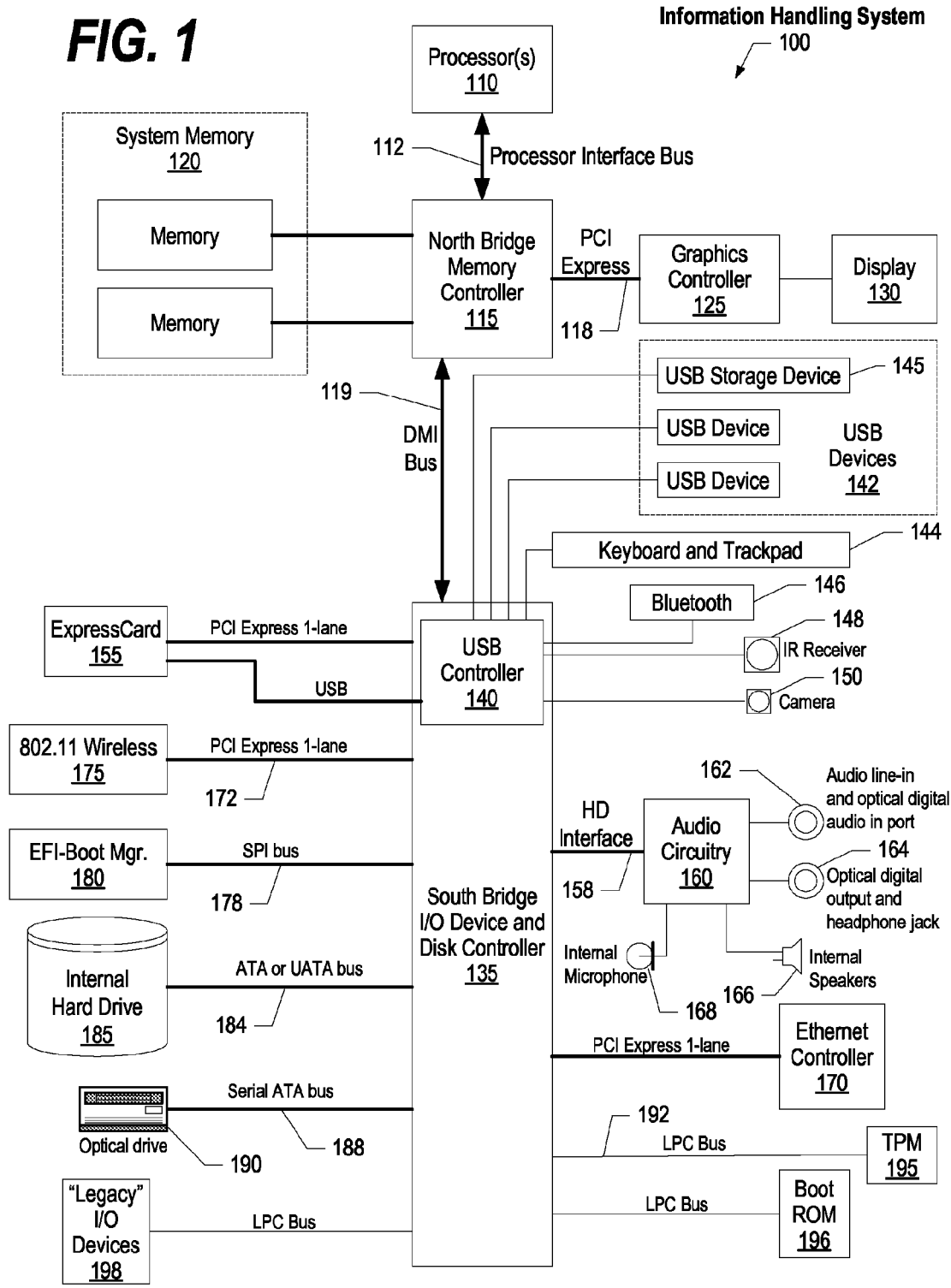
FIG. 1 is a block diagram of a data processing system in which the methods described herein can be implemented.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the IEEE 0.802.11 standards of over-the-air modulation techniques that all use the same protocol to wireless communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 195) shown in FIG. 1 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 2.

Figure 2:
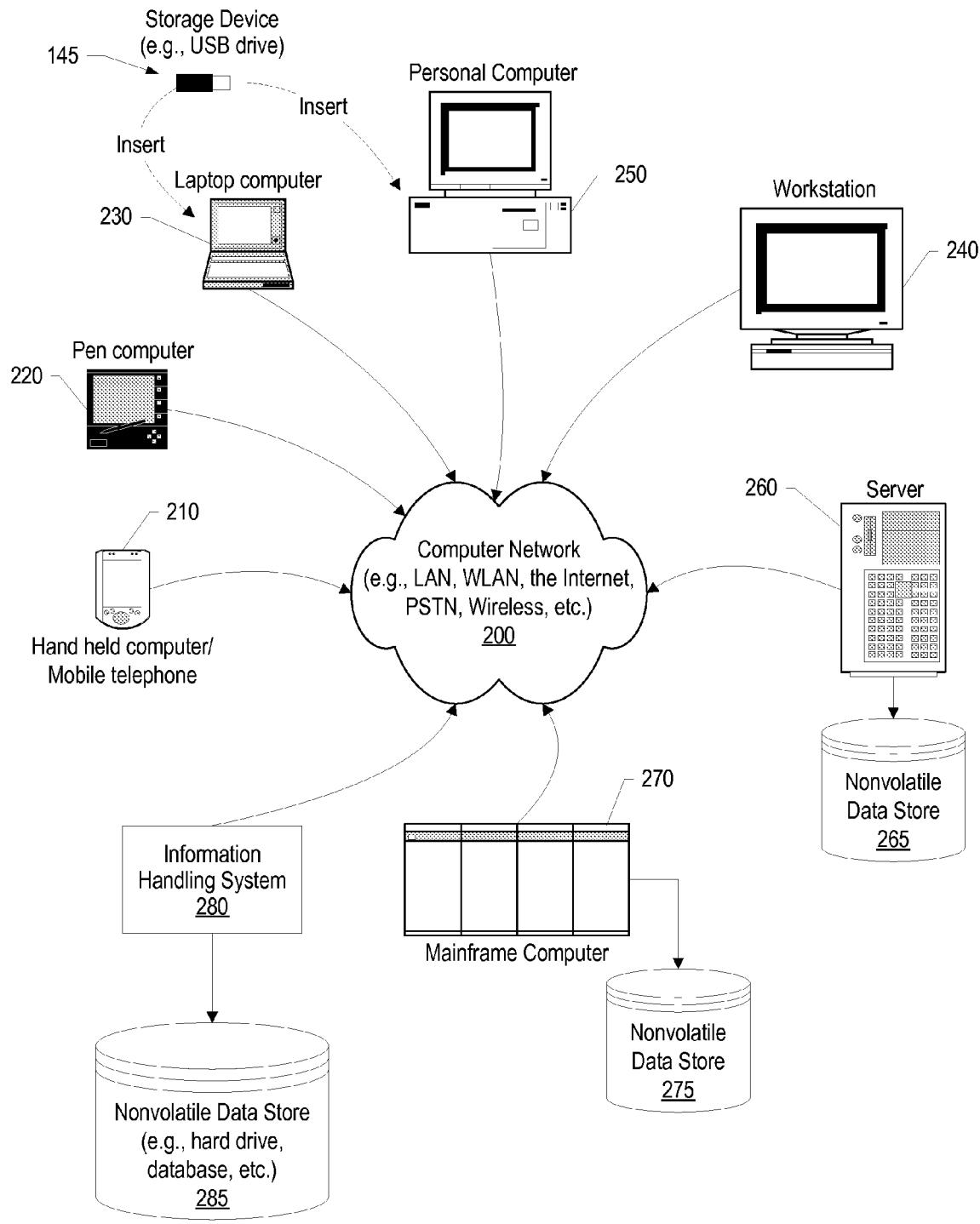
FIG. 2 provides an extension of the information handling system environment shown in FIG. 1 to illustrate that the methods described herein can be performed on a wide variety of information handling systems which operate in a networked environment.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
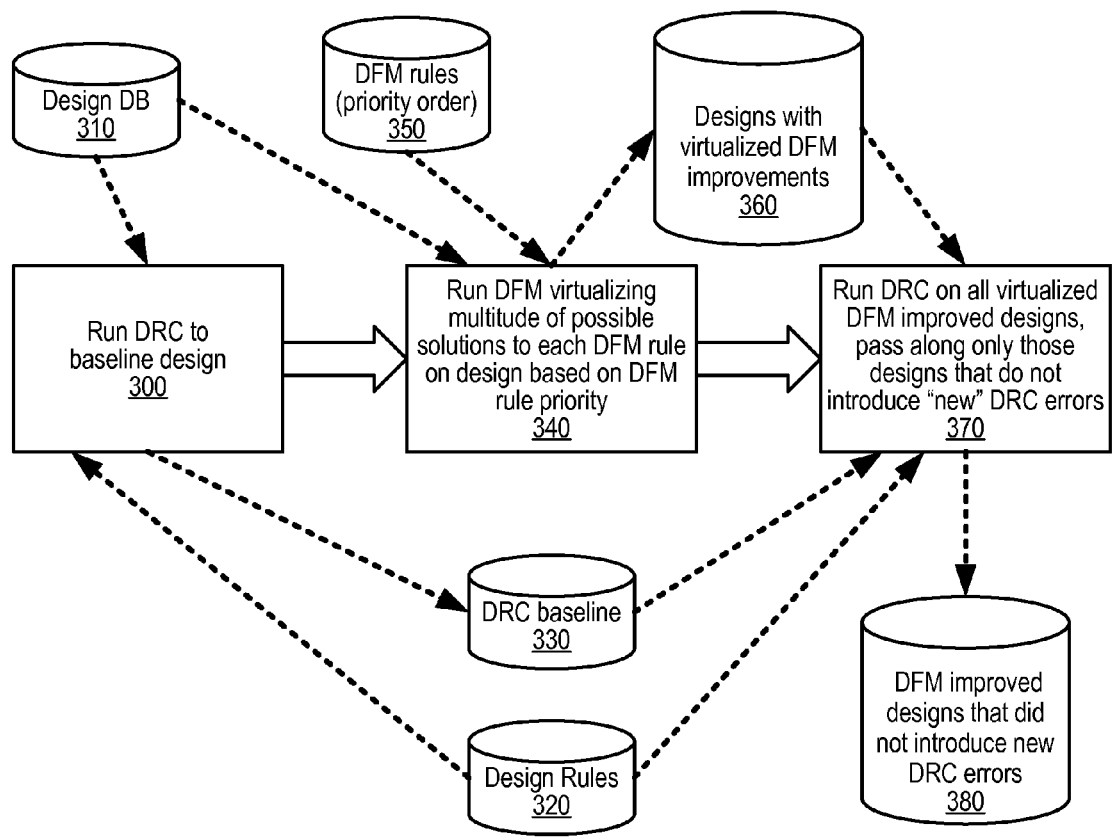
FIG. 3 is a overview diagram showing the general processing flow of prioritized design for manufacturing (DFM) virtualization with design rule checking (DRC)
Figure 4:
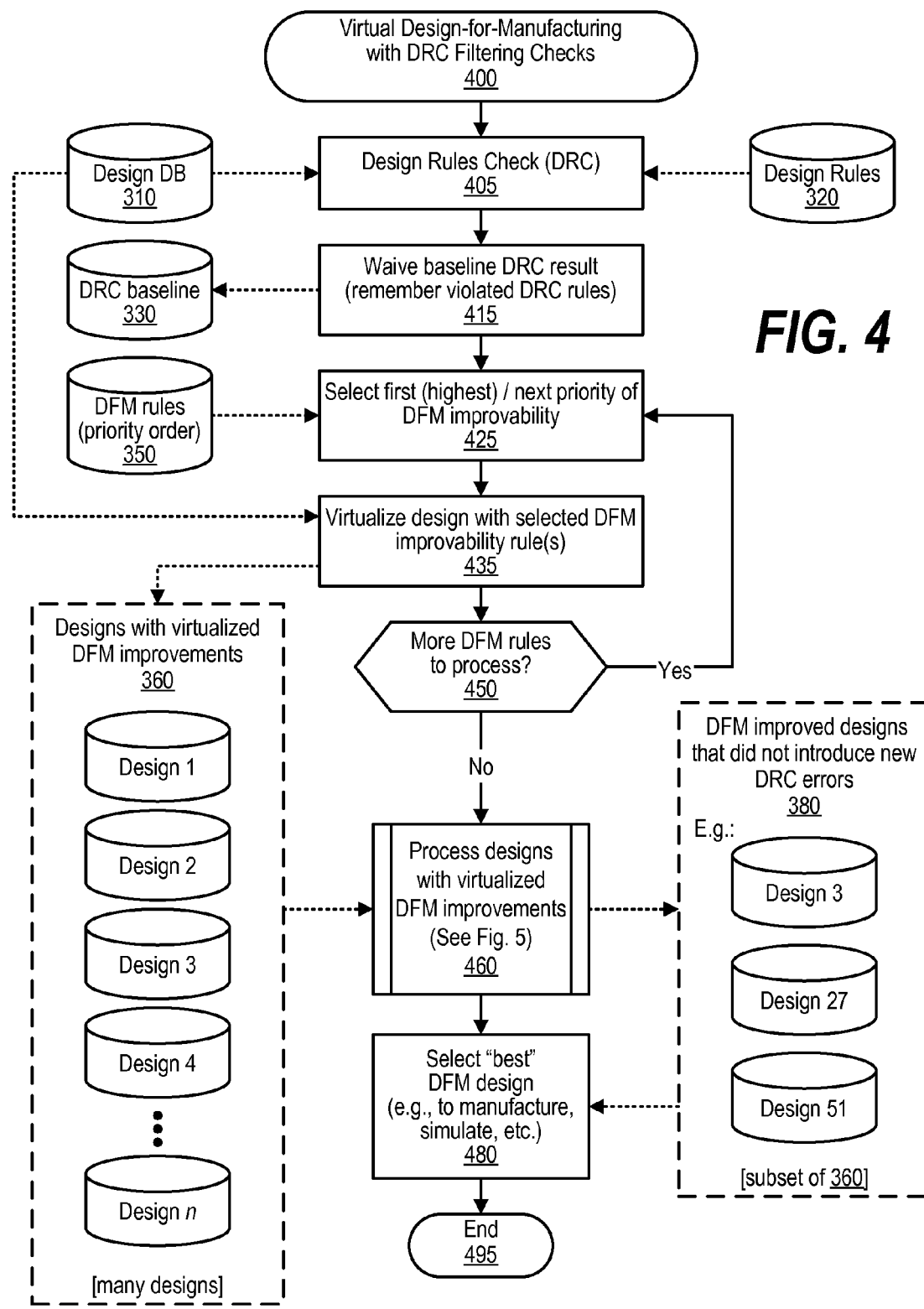
FIG. 4 is a flowchart showing steps performed for virtual design for manufacturing (DFM) with design rule check (DRC) filtering.
Figure 5:
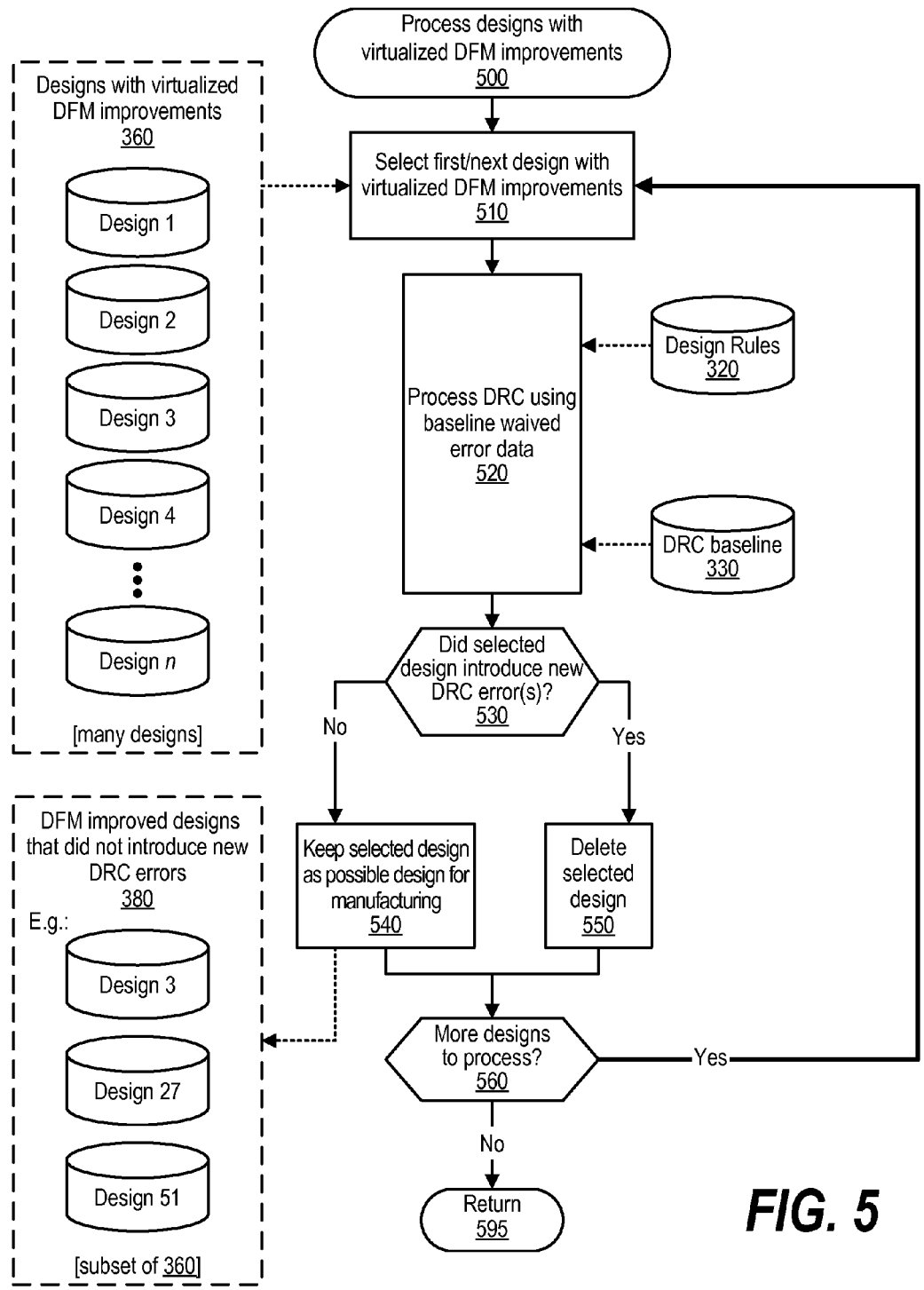
FIG. 5 is a flowchart showing steps performed in processing designs with virtualized design for manufacturing (DFM) improvements.

FIGS. 3-5 depict an approach that can be executed on an information handling system and computer network as shown in FIGS. 1-2. In this approach, a process creates virtualized circuit designs based on a circuit design with the virtualized circuit designs being generated by processing "Design-for-Manufacturing" (DFM) improvements using a variety of DFM processes. After the virtualized circuit designs have been created, full "Design Rules Checking" (DRC) is used to check the virtualized circuit designs to ensure that the DFM processes did not introduce new errors to the design. One of the virtualized circuit designs is selected (e.g., by a user, etc.) based upon the design rule errors introduced by the DFM processes. The DFM process described herein integrates a complete set of DRC processes (e.g., a complete DRC deck, etc.) as part of the flow that generates the virtualized circuit designs. In this manner, the suggested DFM improvements are tested by virtual implementation using the virtualized circuit designs, as opposed to manually testing circuit designs after applying DFM processes.

In one embodiment, a priority is used to order the DFM processes that are used in generating the virtualized circuit designs with the priority being controlled by a file listing the relative priority and resolution of DFM rules in a format that can be easily reordered without requiring recoding of the DFM processes (e.g., reordering of the DFM deck, etc.). Priority controls the order in which the DFM process are applied. In one embodiment, the number of virtual circuit designs is also controllable based on the use of DFM processes and corresponding priorities. The virtual circuit designs are validated by automatically checking the DRC being used in the circuit design. In this manner, virtual circuit designs that introduce additional (unacceptable) DRC errors are filtered out and are not presented to the user for design consideration. In this embodiment, DRC correct improvements are provided to the user for selection of a circuit design that implements desired DFM processes. In this manner, the design cycle time used to close on DFM clean layout is reduced.

In the approach, many possible processes used to meet DFM requirements can be constructed without detailed concern for DRC. A complete DRC run as a post process after generation of the virtualized circuit designs identifies the DFM improvements causing DRC errors and these erroneous virtual circuit designs are removed or filtered out from further consideration. In one embodiment, priorities are established for DFM improvements so that conflicts between different rules are resolved based on the priority with the higher priority rule receiving the DFM improvement. In this embodiment, the priority is managed by an ordered DFM rules list that is read at beginning of the DFM process and results in virtualized circuit designs. Those virtualized circuit designs that pass DRC checking are presented to a user for selection with the presentation also being based on the priority so that the virtualized circuit designs with a higher priority DFM are presented before those with a lower priority.

FIG. 3 is a overview diagram showing the general processing flow of prioritized design for manufacturing (DFM) virtualization with design rule checking (DRC). At step 300, the circuit design, stored in design database 310, is checked against the design rules which are retrieved from data store 320. Checking the circuit design with the DRCs from data store 320 may result in a set of violated DRC rules. The circuit designer may opt to modify the design, thus altering design database 310, to avoid violation of one or more of the DRC rules. However, the circuit designer may decide that it is acceptable to violate one or more DRC rules (e.g., based on the designer's experience, understanding that such violated rules will not impact the circuit performance, etc.). These acceptable DRC rule violations are stored in DRC baseline data store 330. These acceptable DRC rule violations will also be accepted on virtualized circuit designs after DFM processes have been performed on the design. Such acceptable DRC rule violations are referred to as "waived" DRC rules that are ignored by subsequent processes as described below.

At step 340, a number of virtualized circuit designs are generated from the circuit design by utilizing a number of design-for-manufacturing (DFM) processes (e.g., a DFM "deck" that includes a number of such DFM processes, etc.).

The result of step 340 is virtualized circuit designs which are stored in data store 360 (e.g., in a memory, nonvolatile storage device, etc.).

At step 370, the same design rules check (DRC) that was used to develop DRC baseline 330 is used to check the virtualized circuit designs for design rule violations. A quantity of design rule check violations are determined based upon the DRC checking. The design rule check violations that match the waived DRC rules that are being ignored are discarded (removed) so that any remaining DRC rule check violations for a given virtualized circuit design are new. In other words, after removing the DRC rule check violations that match the waived DRC rules, the remaining violations have been introduced to the design as a result of the DFM processes performed at step 340. In a first embodiment, any virtualized circuit designs that introduces new DRC rule violations are discarded from further consideration, while in a second embodiment, a threshold can be set so that DFM processes that introduce few DRC rule violations may also be maintained for consideration so long as the number of introduced DRC rule violations falls below the given threshold. The first embodiment can be seen as having a threshold of zero design rule errors, while the second embodiment can be seen as having a somewhat greater threshold. In the second embodiment, the circuit designer would need to evaluate the impact of the newly introduced DRC rule violations by a given virtualized circuit design to determine whether such rule violations are acceptable or whether they result in the corresponding virtual circuit design being discarded (e.g., ignored, etc.) from further consideration. Remaining virtualized circuit designs (e.g., those with few, if any, DRC rule violations, etc.) are stored in data store 380 for further examination by the circuit designer with one of the remaining virtualized circuit designs being the design that is selected for use in manufacturing the circuit design.

FIG. 4 is a flowchart showing steps performed for virtual design for manufacturing (DFM) with design rule check (DRC) filtering. Processing commences at 400 whereupon, at step 405, the process reads the design rules check (DRC) that has been established for the circuit design. Some of the checks included in the DRC may be common throughout various circuits that are being designed, while other checks may be particular to the type of circuit being designed or even to the particular circuit that is being designed. At step 405, the circuit design, stored in design database 310, is checked using the design rules from data store 320. In many circumstances, the processing of the circuit design with the design rules will result in one or more violated DRCs. At step 415, the circuit designer analyzes the violated design rules and decides which of the DRCs can be waived (ignored). The waived DRC rules that are being ignored for the circuit design are stored in DRC baseline data store 330.

At step 425, the first DFM improvability process is selected from DFM rules data store 350. In one embodiment, the DFM rules are ordered based on priority so that the highest prioritized DFM rule is processed first followed by lower prioritized DFM rules until the lowest priority DFM rule is processed. Examples of DFM rules may be to provide additional contact points for circuit elements, increase the width of connecting wires between circuit elements, etc. At step 435, the circuit design (retrieved from design database 310) is virtualized using the selected DFM process (or processes) which results in a virtualized circuit design. The concept of priority sets which DFM improvement is more important. Improving a layout for one DFM rule may make a subsequent fix for a lower priority rule impossible. For example, adding a second contact may use up space to increase metal overlap of a contact. Having an extra contact might be more important than having a larger enclosure of the contact by metal. Further, having a wider line might have a higher priority than having more space between the lines. Hence, priority provides a way of making these design tradeoffs. The resulting virtualized circuit design is stored in storage area 360. A decision is made as to whether there are more DFM rules to process (decision 450). If there are more DFM rules to process, then decision 450 branches to the "yes" branch which loops back to select the next DFM improvability process (or processes) from which a virtualized circuit design is generated as described above. This looping continues until there are no more DFM rules to process (e.g., the lowest prioritized DFM rule has been processed, etc.), at which point decision 450 branches to the "no" branch for further processing.

At predefined process 460, the virtualized circuit designs are processed using the DRC rules from data store 320 (see FIG. 5 and corresponding text for processing details). The result of predefined process 460 is a set of one or more virtualized circuit designs that have been selected and retained in data store 380 with the retained virtualized circuit designs having acceptable design rule error quantities. Note that the virtualized circuit designs in data store 380 are a subset of the designs found in data store 360. In one embodiment, after eliminating the waived DRC rules that are being ignored, the acceptable design rule error quantity is zero (e.g., acceptable virtualized circuit designs do not introduce any additional DRC errors, etc.). In other embodiments, the number of introduced DRC errors must fall below a given threshold with the circuit designer determining whether such introduced DRC errors are acceptable. At step 480, the circuit designer selects the "best" virtualized circuit design to use in the manufacturing process (e.g., in simulation, to manufacture, etc.). In one embodiment, the virtualized circuit designs stored in data store 380 are ordered based on DFM priorities. In the example shown, Virtualized Circuit Designs 3, 27, and 51 were found to be acceptable in terms of DRC error introduction (e.g., these virtualized circuit designs did not introduce any new DRC errors, etc.). Of these, Design 3 (the third virtual circuit design generated) would have a higher DFM priority than either Design 27 or 51. In this manner, the circuit designer can focus attention to the higher priority virtualized circuit designs in selecting the "best" virtualized circuit design to use in manufacturing. Processing thereafter ends at 495.

FIG. 5 is a flowchart showing steps performed in processing designs with virtualized design for manufacturing (DFM) improvements. FIG. 5 is a routine called from predefined process 460 in FIG. 4. FIG. 5 processing commences at 500 whereupon, at step 510, the process selects the first virtualized circuit design from data store 360. The virtualized circuit designs stored in data store 360 were generated by one or more DFM improvement processes that were executed on the circuit design.

At step 520, the selected virtualized circuit design is checked using the design rule checks (DRGs) that were used to check the circuit design. The design rules are retrieved from design rule data store 320. In addition, at step 520, those design rules that were waived (ignored) from the processing of the circuit design are compared to the design rule violations found by processing the selected virtual circuit design. Because the waived design rule violations were found in the circuit design, it is likely that most, if not all, of the virtualized circuit designs will also have these design rule violations. Therefore, at step 520, the waived design rule violations are removed from the list of design rule violations that apply to the selected virtualized circuit design. In addition, a count of the number (quantity) of design rule violations is maintained for each of the virtualized circuit designs. If a selected virtualized circuit design resulted in a design rule error quantity of three violations, but each of the design rule violations matched a waived DRC rule that is being ignored, then the design rule error quantity for the selected virtualized circuit design would be zero. However, if the DRC check of the same virtualized circuit design resulted in five violated DRC rules and only three of the design rule violations matched a waived DRC rule that is being ignored, then the design rule error quantity for the selected virtualized circuit design would be two errors (five minus three).

A decision is made as to whether the selected virtualized circuit design, after being checked using the DRC rules, has more DRC violations than permitted (decision 530). In one embodiment, any new DRC errors (new errors greater than zero) results in the selected design not being retained. On the other hand, on other embodiments, designs that introduce some new errors (e.g., below a threshold value, etc.) are retained. If the selected virtualized circuit design did not introduce too many errors, then decision 530 branches to the "no" branch whereupon, at step 540, the selected virtualized circuit design is retained in data store 380 for further consideration and possible use in manufacturing. On the other hand, if the selected virtualized circuit design introduced too many errors, then decision 530 branches to the "yes" branch whereupon, at step 550, the selected virtual circuit design is discarded.

A decision is made as to whether there are more virtualized circuit designs to process as described above (decision 560). If there are additional virtualized circuit designs to process, then decision 560 branches to the "yes" branch which loops back to select the next virtualized circuit design from data store 360, check the selected design using the design rules (DRGs), and determine whether to retain or discard the design. This looping continues until there are no more virtualized circuit designs to process, at which point decision 560 branches to the "no" branch whereupon processing returns to the calling routine (see FIG. 4) at 595.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method performed by an information handling system that runs one or more software tools, the method comprising:
   generating a plurality of virtualized circuit designs by applying a plurality of design-for-manufacturing (DFM) processes to a circuit design, the generating performed by at least one processor that executes one of the software tools running on the information handling system, and wherein the virtualized circuit designs and the circuit design are stored in a memory included in the information handling system;
   checking, using one of the software tools running on the information handling system, the plurality of virtualized circuit designs with a plurality of design rule checks (DRGs), the checking resulting in a design rule error quantity corresponding to each of the virtualized circuit designs, the checking performed by at least one processor that executes one of the software tools running on the information handling system, and wherein the design rule error quantity is stored in the memory included in the information handling system; and
   based on the corresponding design rule error quantities, selecting one of the virtualized circuit designs to use in manufacturing the circuit design.

2. The method of claim 1 wherein the checking further results in one or more design rule check violations corresponding to each of the virtualized circuit designs with design rule error quantities greater than zero, wherein the method further comprising:
   checking the circuit design with the plurality of DRCs, the checking resulting in a baseline set of violated DRC rules;
   analyzing the baseline set of violated DRC rules, wherein the analysis results in a set of waived DRC rules to ignore;
   removing the design rule check violations that match one of the waived DRC rules to ignore; and
   reducing the design rule error quantities based upon the removal of the design rule check violations.

3. The method of claim 2 further comprising:
after the reduction of design rule error quantities:
comparing the design rule error quantity corresponding to each of the virtualized circuit designs with a threshold; and
generating a set of one or more selectable virtualized circuit designs from the one or more virtualized circuit design by removing any of the virtualized circuit designs with design rule error quantities that exceed the threshold, wherein the selected virtualized circuit designs is selected from the set of selectable virtualized circuit designs.

4. The method of claim 3 wherein the threshold is set to zero so that any of the virtualized circuit designs that introduce one or more new DRC errors are removed from the set of selectable virtualized circuit designs.

5. The method of claim 1 wherein the plurality of DFM processes are ordered based upon a priority.

6. The method of claim 1 wherein the selection of the virtualized circuit design to use in manufacturing the circuit design is further based on the DFM process used to generate the corresponding virtual circuit design.

7. The method of claim 6 wherein the selection is further based on a priority assigned to the DFM process used to generate the corresponding virtual circuit design.

8. An information handling system comprising:
one or more processors;
a memory coupled to at least one of the processors;
a set of instructions stored in the memory and executed by at least one of the processors to increase password strength, wherein the set of instructions perform actions of:
generating a plurality of virtualized circuit designs by applying a plurality of design-for-manufacturing (DFM) processes to a circuit design;
checking the plurality of virtualized circuit designs with a plurality of design rule checks (DRGs), the checking resulting in a design rule error quantity corresponding to each of the virtualized circuit designs; and
based on the corresponding design rule error quantities, receiving a selection of one of the virtualized circuit designs to use in manufacturing the circuit design.

9. The information handling system of claim 8 wherein the checking further results in one or more design rule check violations corresponding to each of the virtualized circuit designs with design rule error quantities greater than zero, and wherein the actions further comprise:
checking the circuit design with the plurality of DRCs, the checking resulting in a baseline set of violated DRC rules;
analyzing the baseline set of violated DRC rules, wherein the analysis results in a set of waived DRC rules to ignore;
removing the design rule check violations that match one of the waived DRC rules to ignore; and
reducing the design rule error quantities based upon the removal of the design rule check violations.

10. The information handling system of claim 9 wherein the actions further comprise:
after the reduction of design rule error quantities:
comparing the design rule error quantity corresponding to each of the virtualized circuit designs with a threshold; and
generating a set of one or more selectable virtualized circuit designs from the one or more virtualized circuit design by removing any of the virtualized circuit designs with design rule error quantities that exceed the threshold, wherein the selected virtualized circuit designs is selected from the set of selectable virtualized circuit designs.

11. The information handling system of claim 10 wherein the threshold is set to zero so that any of the virtualized circuit designs that introduce one or more new DRC errors are removed from the set of selectable virtualized circuit designs.

12. The information handling system of claim 8 wherein the plurality of DFM processes are ordered based upon a priority.

13. The information handling system of claim 8 wherein the selection of the virtualized circuit design to use in manufacturing the circuit design is further based on the DFM process used to generate the corresponding virtual circuit design.

14. The information handling system of claim 13 wherein the selection is further based on a priority assigned to the DFM process used to generate the corresponding virtual circuit design.

15. A computer program product stored in a non-transitory computer readable storage medium, comprising computer program code that, when executed by an information handling system, causes the information handling system to perform actions comprising:
generating a plurality of virtualized circuit designs by applying a plurality of design-for-manufacturing (DFM) processes to a circuit design;
checking the plurality of virtualized circuit designs with a plurality of design rule checks (DRGs), the checking resulting in a design rule error quantity corresponding to each of the virtualized circuit designs; and
based on the corresponding design rule error quantities, selecting one of the virtualized circuit designs to use in manufacturing the circuit design.

16. The computer program product of claim 15 wherein the checking further results in one or more design rule check violations corresponding to each of the virtualized circuit designs with design rule error quantities greater than zero, and wherein the actions further comprise:
checking the circuit design with the plurality of DRCs, the checking resulting in a baseline set of violated DRC rules;
analyzing the baseline set of violated DRC rules, wherein the analysis results in a set of waived DRC rules to ignore;
removing the design rule check violations that match one of the waived DRC rules to ignore; and
reducing the design rule error quantities based upon the removal of the design rule check violations.

17. The computer program product of claim 16 wherein the actions further comprise:
after the reduction of design rule error quantities:
comparing the design rule error quantity corresponding to each of the virtualized circuit designs with a threshold; and
generating a set of one or more selectable virtualized circuit designs from the one or more virtualized circuit design by removing any of the virtualized circuit designs with design rule error quantities that exceed the threshold, wherein the selected virtualized circuit designs is selected from the set of selectable virtualized circuit designs.

18. The computer program product of claim 15 wherein the plurality of DFM processes are ordered based upon a priority.

19. The computer program product of claim 15 wherein the selection of the virtualized circuit design to use in manufacturing the circuit design is further based on the DFM process used to generate the corresponding virtual circuit design.

20. The computer program product of claim 19 wherein the selection is further based on a priority assigned to the DFM process used to generate the corresponding virtual circuit design.

\* \* \* \* \*